(12) United States Patent
Salvador

(10) Patent No.: US 9,543,918 B1
(45) Date of Patent: *Jan. 10, 2017

(54) CONFIGURING NOTIFICATION INTENSITY LEVEL USING DEVICE SENSORS

(71) Applicant: Amazon Technologies, Inc., Reno, NV (US)

(72) Inventor: Stan Weidner Salvador, Tega Cay, SC (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/804,176

(22) Filed: Jul. 20, 2015

Related U.S. Application Data

(63) Continuation of application No. 13/749,491, filed on Jan. 24, 2013, now Pat. No. 9,088,668.

(51) Int. Cl.
- *H04M 1/00* (2006.01)
- *H03G 3/20* (2006.01)
- *G08B 3/10* (2006.01)

(52) U.S. Cl.
CPC ............. *H03G 3/20* (2013.01); *G08B 3/1008* (2013.01)

(58) Field of Classification Search
CPC .................................................. H04M 19/042
USPC .................................. 455/412.2, 457, 414.1
See application file for complete search history.

(56) References Cited

U.S. PATENT DOCUMENTS

| | | | |
|---|---|---|---|
| 6,907,277 B1 | 6/2005 | Shim | |
| 8,452,344 B2 | 5/2013 | Eronen et al. | |
| 9,088,668 B1 | 7/2015 | Salvador | |
| 2008/0161064 A1 | 7/2008 | Lewis et al. | |
| 2008/0167006 A1 | 7/2008 | Hsi | |
| 2008/0268911 A1 | 10/2008 | Eronen et al. | |
| 2009/0305744 A1 | 12/2009 | Ullrich | |
| 2009/0312000 A1 | 12/2009 | Wakefield et al. | |
| 2011/0012746 A1 | 1/2011 | Fish, Jr. et al. | |
| 2013/0012270 A1 | 1/2013 | Naftolin | |

*Primary Examiner* — Charles Shedrick
(74) *Attorney, Agent, or Firm* — Polsinelli, LLP

(57) ABSTRACT

A computing device can utilize one or more sensors to capture data associated with a current environment, state, condition, property, etc. of the device. Based at least in part on the captured data, the current environment, state, condition, property, etc. of the computing device can be determined or identified. Based on the determined/identified current environment, state, condition, property, etc., the computing device can configure the notification intensity level for the device. The device can determine a suitable notification intensity level and set that notification intensity level for the device. An incoming communication received at the computing device while the device is still associated with the determined/identified current environment, state, condition, property, etc. can cause a notification to be outputted at the set notification intensity level.

20 Claims, 13 Drawing Sheets

CONFIGURING NOTIFICATION INTENSITY LEVEL USING DEVICE SENSORS

CROSS-REFERENCE TO RELATED APPLICATIONS

This application is a continuation of U.S. application Ser. No. 13/749,491, filed Jan. 24, 2013, entitled "CONFIGURING NOTIFICATION INTENSITY LEVEL USING DEVICE SENSORS," which is hereby expressly incorporated herein by reference in its entirety.

BACKGROUND

Computing devices are becoming more commonplace and are used for a wide variety of purposes. Computing devices can be used to make and receive phone calls as well as to send and receive messages. When a computing device receives an incoming call or message, the device can produce or output a notification such as a ring, a beep, or a vibration. The notification can be produced or outputted at a particular intensity level (e.g., at a particular volume level for audible notifications, at a particular vibration strength level for vibrating notifications), such that a user of the device can notice the incoming call or message. However, according to social norms and/or the user's own preferences, notification intensity levels should be adjusted appropriately for different situations. For example, it may be appropriate to reduce the notification intensity level for the user's device while the user is watching a movie. In another example, it may be preferable to increase the notification intensity level at a bar with a loud noise level. Conventional approaches typically permit the user to manually configure or adjust the notification intensity levels for the device, which can be cumbersome and/or inconvenient to the user, thereby reducing the overall user experience associated with using the device.

BRIEF DESCRIPTION OF THE DRAWINGS

Various embodiments in accordance with the present disclosure will be described with reference to the drawings, in which.

DETAILED DESCRIPTION

Figure 1:
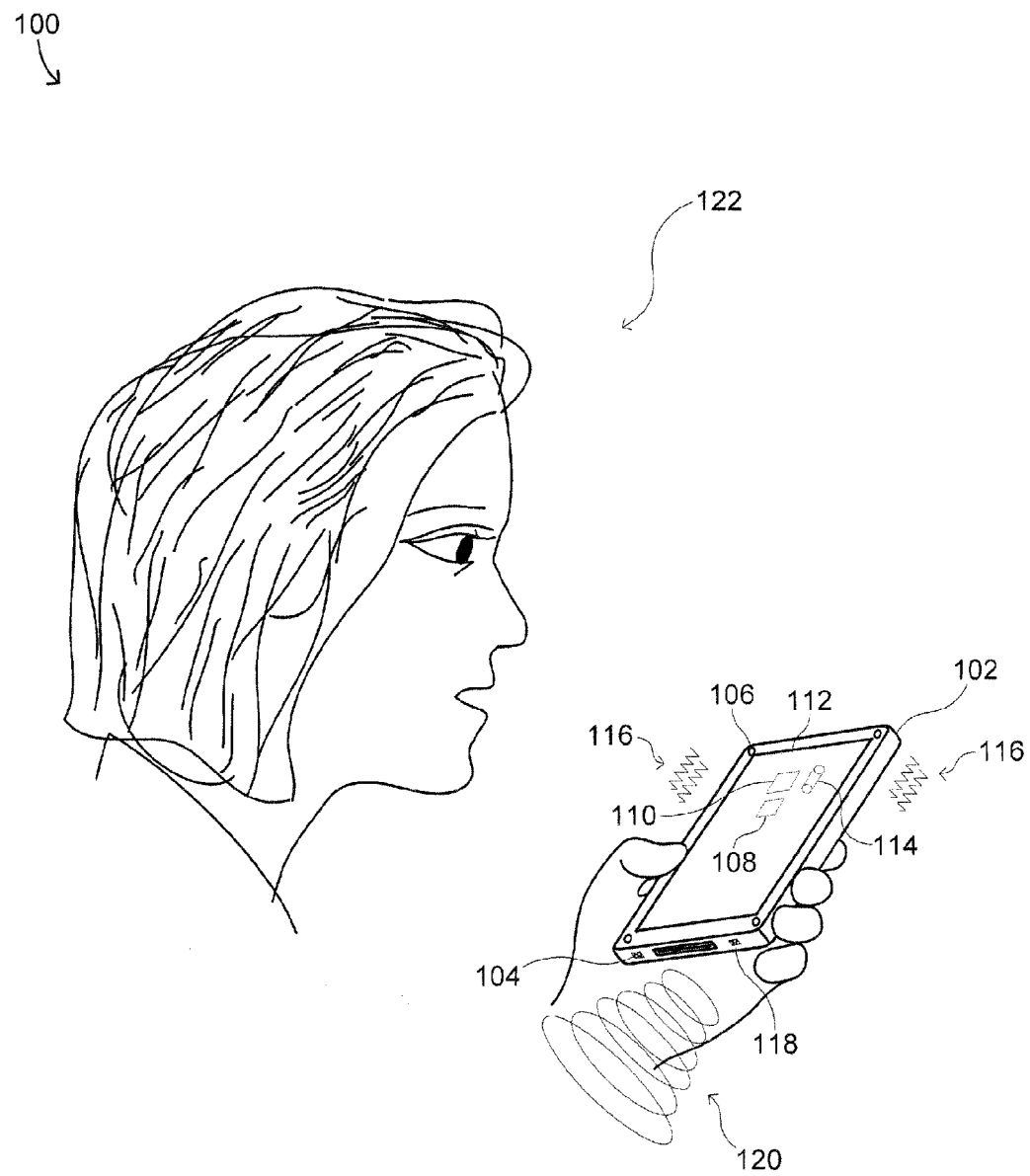
FIG. 1 illustrates an example environment in which aspects of the various embodiments can be utilized.

Systems and methods in accordance with various embodiments of the present disclosure overcome one or more of the above-referenced and other deficiencies in conventional approaches to providing notifications to a user of a computing device. In particular, various embodiments of the present disclosure can configure notification intensity levels for a computing device depending at least in part on information such as information about an environment of the device.

At least some embodiments enable a computing device to utilize one or more sensors of the device to gather or obtain various forms or types of data, which can be analyzed by the device (or a system or service in communication with the device). The results of the analysis of the data can be used to determine or identify characteristics of an environment of the device. The characteristics may be used to determine a notification level for the device. Other information may also be used to determine a notification level; for example, a current state of the device and/or a condition/property with which the device currently is associated can be used to determine a notification level. To determine a notification level, a model of appropriate notification levels may be used. A device may be preconfigured with the model and the model may be trained or adapted to the preferences of a user. Based on the determined characteristic(s), the model, and/or other information, an appropriate level of notification intensity can be determined and set for the device. An incoming communication received while the device is associated with the (current) environment can cause a notification to be produced or outputted at the set level of notification intensity. An appropriate notification level can be determined by a variety of criteria and it not limited to any particular criteria. For example, the appropriate notification level may be an estimate of what is desired or preferred by a user or the appropriate notification level may be an estimate of what is acceptable based on social norms.

In some embodiments, the one or more sensors can include a microphone configured to facilitate in determining whether the environment of the computing device is quiet or noisy and determine a noise characteristic from the microphone data. If the current environment is quiet, then the notification intensity level can be decreased. If the environment is noisy, then the notification intensity level can be increased.

In some embodiments, the one or more sensors can include a camera and/or a touch sensor, each configured to facilitate in determining whether the device is active or idle and determine a corresponding characteristic from the sensor data. If the device is active (e.g., being actively interacted with, at least recently), then the notification intensity level can be decreased.

In some embodiments, the one or more sensors can include an orientation sensor configured to facilitate in determining an orientation (which can be a current state, condition, property, etc.) of the device. If the orientation of the device suggests that the device is on a flat surface, such as a desk or table, then the notification intensity level for the device can initially be set at a lower level and gradually increase if the user does not respond. If the orientation of the device suggests that the device is in a pocket, bag, holster, etc. of the user, then the notification intensity level for the device can be increased.

In some embodiments, the one or more sensors can include a location sensor configured to facilitate in determining whether the current environment of the computing device is quiet or noisy. If the location sensor indicates that the device is at a geolocation that is likely to be quiet, then the notification intensity level can be decreased. If the location sensor indicates that the device is at a geolocation that is likely to be noisy, then the notification intensity level can be increased.

In some cases it can be advantageous to find the lowest notification intensity level that will still result in a response from the user within an acceptable response time frame. As such, in some embodiments, the level of notification intensity can be set to be lower initially. Then after each time interval that the user does not respond, the notification intensity level can be increased incrementally. The increased notification intensity that receives a response by the user can be used to update the predictive model that determines appropriate notification levels over various environmental characteristics.

Various other functions and advantages are described and suggested below as may be provided in accordance with the various embodiments.

FIG. 1 illustrates an example environment 100 in which aspects of the various embodiments can be utilized. The example environment 100 can comprise an example computing device 102 with one or more sensors. The one or more sensors can include, for example, at least one of an audio capture component (e.g., audio sensor, microphone, etc.) 104, an image capture component (e.g., image sensor, camera, etc.) 106, an orientation sensor (e.g., accelerometer, gyroscope, etc.) 108, a location sensor (e.g., GPS chip) 110, or a touch sensor (e.g., touch screen) 112. The one or more sensors of the computing device 102 can also include a light sensor for detecting light. In some embodiments, the camera 106 can be configured to detect light and can function as the light sensor.

In some embodiments, the one or more sensors can be configured to capture various forms of data associated with an environment in which the computing device is currently situated. For example, the (current) environment of the computing device can be a pocket of a user 122 of the computing device 102. In another example, the current environment of the computing device 102 can be the inside of a purse of the user 122 who is attending a specific concert on Thursday Dec. 6, 2012 at 10:00 AM PST. In a further example, the current environment of the device 102 can be in a device cradle within an automobile of the user 122 near the address of 555 Sunset Blvd.

In some embodiments, the current environment can be associated with a current state of the device 102. For example, the current state of the device 102 can indicate that the device 102 is oriented in a particular manner (e.g., that the face of the device 102 is within an allowable deviation from being parallel to a horizontal plane, such as the floor). In another example, the current state of the device 102 can indicate that the device 102 has established a particular connection (e.g., to a cellular network, to a WiFi network, to another device via Bluetooth, etc.). In a further example, the current state of the device 102 can indicate a property or attribute of the device 102 (e.g., the device operating system version information, a particular device setting, the remaining battery life for the device 102, etc.)

As shown in FIG. 1, the example computing device 102 can also include a vibration alert motor 114 configured to produce an alert (i.e., notification) in the form of causing the device 102 to vibrate 116. Moreover, the computing device 102 can include an audio output component (e.g., speaker) 118 configured to produce an audible alert/notification 120, such as a ring, beep, etc.

When the computing device 102 receives a particular type of communication or signal, such as a phone call, a video call, a SMS text message, an Internet communication, an software alert, etc., the device 102 can produce an alert/notification in the form an audible ring, beep, etc., and/or a vibration. A user 122 of the device 102 can configure settings for the alert/notification, including an intensity level setting for the notification (e.g., how loud or soft a ringtone will be, how loud or soft a beep will be, how strong or weak a vibration will be, etc.). Typically, this is done by having the user 122 manually set the intensity level for each type of notification (e.g., the volume level for a ringtone/beep, the strength level for a vibration, etc.).

Various embodiments of the present disclosure enable the computing device 102 to determine a level of notification intensity and set the device 102 to that notification intensity level at certain times and/or for certain situations. The computing device 102 can receive data captured or obtained by the one or more sensors and use the data to determine/identify a current environment of the device 102, a current state of the device 102, a condition/property with which the device 102 is currently associated, and/or a situation in which the device 102 is currently involved, etc. For example, the device 102 can use the various data from the device sensors in conjunction to identify multiple possible choices for the current environment, state, condition, etc., each choice having a confidence score, and then the device 102 can determine/identify the current environment, state, condition, etc., to be the choice with the highest confidence score. Based on the determined/identified current environment, state, condition, etc., the device 102 can configure the intensity level for notifications without requiring manual adjustment by the user 122. In other words, depending on what the current environment, state, etc., of the device 102 is, the device 102 can automatically determine and set an appropriate level of notification intensity.

Figure 2:
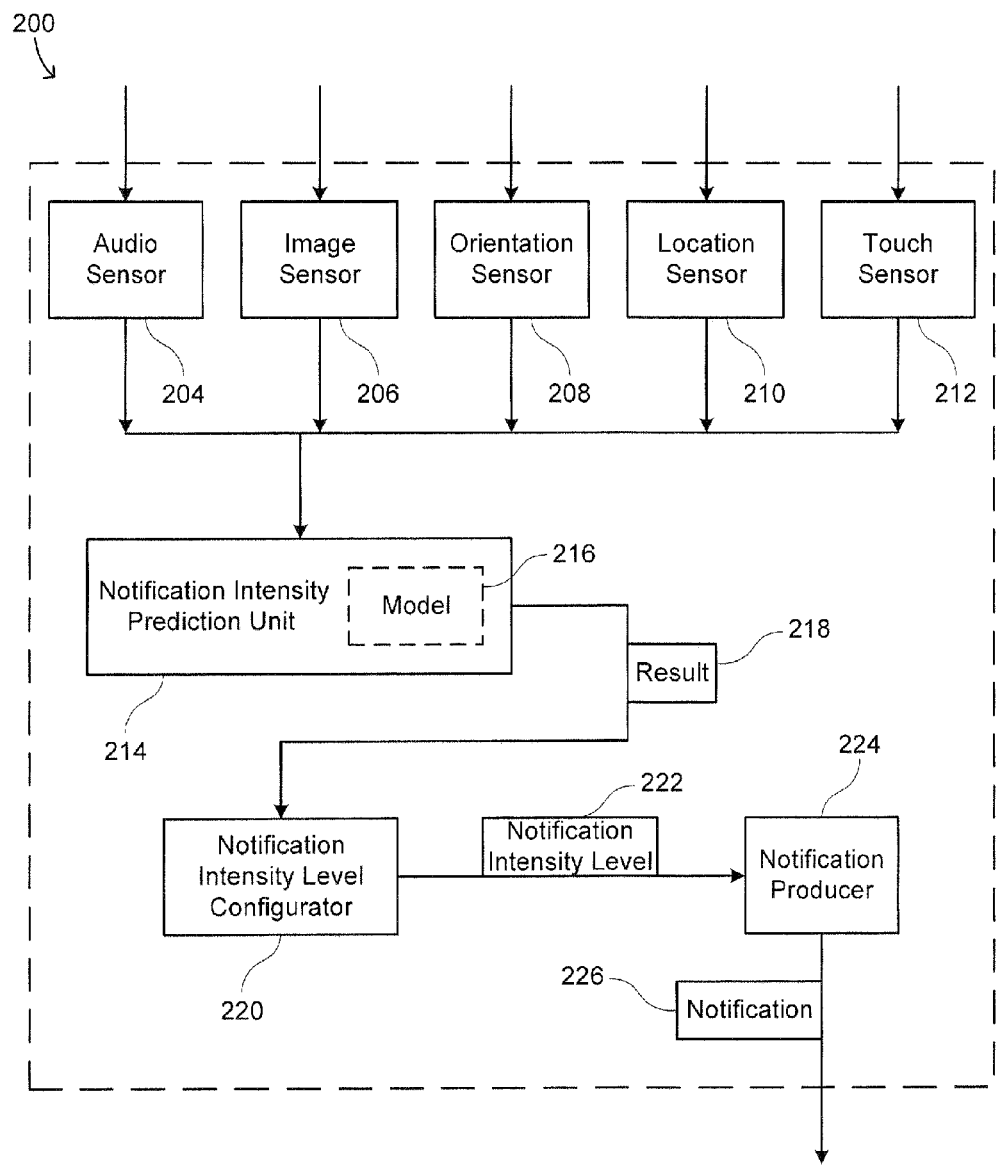
FIG. 2 illustrates an example system embodiment for configuring notification intensity level using device sensors.

FIG. 2 illustrates an example system embodiment 200 for configuring notification intensity level using device sensors. The example system embodiment 200 can comprise one or more sensors, such as an audio sensor(s) 204, an image sensor(s) 206, an orientation sensor(s) 208, a location sensor(s) 210, and a touch sensor(s) 212. The sensors in FIG. 2 are shown for illustrative purposes only and are not meant to be limiting in nature. It is contemplated that a person of ordinary skill in the art would recognize that some embodiments consistent with the present disclosure may not require all of these sensors while some embodiments consistent with the present disclosure can include additional sensors.

Each of the one or more sensors (e.g., 204, 206, 208, 210, 212, etc.), when available, can be configured to capture data. For example, the audio sensor(s) 204 can be at least one microphone configured to capture a sound. The image sensor(s) 206 can be at least one camera configured to capture an image. The orientation sensor(s) 208 can be at least one gyroscope, accelerometer, electronic compass, magnetometer, etc., configured to capture orientation information associated with the system 200. The location sensor(s) 210 can be at least one Global Positioning System (GPS) chip and/or radio transceiver configured to determine geolocation information associated with the system 200. The touch sensor(s) 212 can be at least one touchscreen configured to detect a touch with respect to the system 200, such as a tapping of the touch sensor(s) 212 by a user of the system 200.

In some embodiments, the image sensor(s) 206 can also be a light sensor(s) configured to detect light. For example, the image sensor(s) 206 can detect whether light received at the image sensor(s) 206 has exceeded or is below a light level threshold. This can be useful in determining whether or not the current environment is a dark environment, such as a pocket, a wallet, a bag, a holster, etc., of the user.

In some embodiments, the touch sensor(s) 212 can work in conjunction with a pressure sensor(s) configured to detect a pressure applied to the system 200. For example, the pressure sensor can detect one or more presses relative to the system 200 that are distinguishable from fingertip taps (which can be detected by the touch sensor 212). If data from other sensors indicate that there is a possibility that the system 200 is in the user's pocket, bag, etc., then the likelihood that the system 200 is in the user's pocket, bag, etc. can be increased because the one or more presses can be accidental/unintentional presses (e.g., caused by the user moving around, caused by objects in the user's bag pressing against the system 200, etc.). The likelihood can also be further increased if, for example, the current system state indicates that the system 200 is in a locked screen mode, an idle mode, or an inactive mode.

The data captured by the one or more sensors of the system can be used by the notification intensity prediction unit 214 (which can use a model 216) to determine an appropriate notification level based on the current sensor inputs. The model can be a prediction model trained to generate the minimum notification level that produces a fast response time from the user based on the current sensor data. The model can take one or more of many forms, including (but not limited to): rules written by a human, a series of conjunctive rules learned from a machine learning algorithm, a neural network, a decision tree, regression, or a support vector machine. The notification intensity predictor unit and associated model could comprise of several predictive algorithms (possibly of different types/algorithms) that are fused together to vote on a notification level. An example of one of the potential predictive algorithms is a predictor that is used to generate a suggested notification level based only on geolocation. Other intensity predictor algorithms may similarly predict the notification level based on other individual sensor inputs, combinations of sensor inputs, and/or higher-level generated features such as the estimated probability that the phone is in a pocket or being held in a hand (based on various sensor inputs). The fusion of the different predictive algorithms into a single intensity prediction can be done linearly (e.g., average, median, weighted sum, linear regression, etc.), non-linearly (e.g., support vector machine, neural network, rules learned from data, decision trees, etc.), and/or by using specified rules.

The initial model can be a general model trained on sensor data and notification response data over many different users (which may include: times to answer, notification levels when answered, manually adjusted notification levels). As data is collected for a particular user, this general model may be adapted so it generates notification levels that are more appropriate for that specific user. Adapting the user-specific notification intensity model may include updating the parameters of the algorithm that performs fusion between the environment-specific intensity predictors and higher level generated features in a way that causes the output of the notification intensity predictor to output the minimum notification intensity required to get a response from the user based on past observations. Additional adaptation could also be performed for many of the component intensity predictors that have their output fused together.

In some embodiments, the model 216 can be created using, at least in part, training data which can include data captured using the sensors, environmental characteristic(s) determined based on the data, the appropriate notification levels corresponding to the data, and/or other information. By analyzing the training data, the system 200 can learn from the training data how to set the notification level.

In some embodiments, the model 216 can be a classification model. At least a portion of the classification model can be directed to and/or focused on a particular form/type of data. For example, orientation data (e.g., obtained/determined by the orientation sensor 210) can be analyzed using a particular portion of the classification model that handles orientation data. This orientation-focused portion of the classification model can distinguish among various device orientations, such as when the device is in the user's pocket, when the device is held in the user's hand(s), or when the device is in a cradle/holder in the user's automobile.

In some embodiments, the classification model can be improved over time. For example, the classification model can be retrained, retested, and/or modified based on new data received over time.

Based on the determined/identified current environment, state, condition, etc., (result 218), a notification intensity level configurator 220 can configure (e.g., determine, set) an appropriate level of notification intensity 222 for the system 200. For example, if the current environment, state, condition, etc. is determined/identified to be associated with a loud environment, then the notification intensity level configurator 220 can determine that the appropriate notification intensity level should be increased and set the notification intensity at an increased level.

As shown in FIG. 2, a notification producer 224 of the system 200 (e.g., a sound card, a speaker, and/or a vibration motor, etc.) would then produce or output notifications 226 at the determined/set notification intensity level 222. Continuing with the previous example, if an incoming phone call is received by the system 200 while in a loud environment (such as a dance party), then the system 200 can output a ringtone 226 and/or a vibration 226 with the increased intensity level via the speaker 224 and/or vibration motor 224, respectively.

Figure 3A:
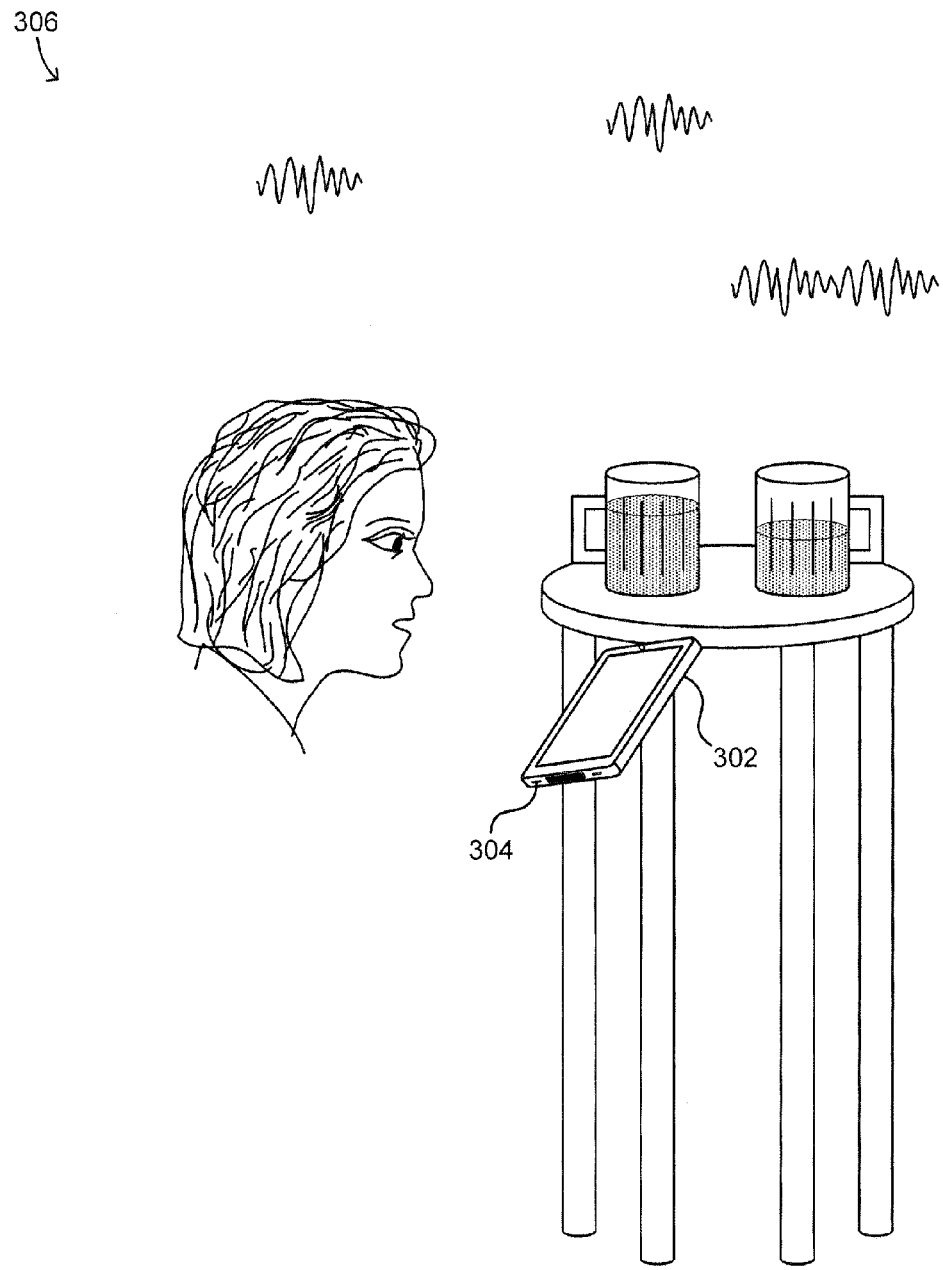
FIG. 3A illustrates an example device embodiment for configuring notification intensity level using device sensors.

FIG. 3A illustrates an example device embodiment 302 for configuring notification intensity level using device sensors. In general, the device can use any or all available sensors to capture data and configure the level of notification intensity for the device based at least in part on the data. For example, in FIG. 3A, the computing device embodiment 302 can utilize a microphone 304 to capture sound data associated with a current environment 306 of the device 302. The microphone 304 can capture background or ambient associated with the current environment 306. In the example of FIG. 3A, the device 302 can determine from the environment characteristic(s) (e.g., the sound data associated with the current environment) that the current environment 306 is a loud and noisy environment, such as a bar. Therefore, the device 302 can decide to increase its notification intensity level.

In some embodiments, the example computing device 302 can also attempt to recognize the current environment based on sounds perceived at the environment. For example, based on finding a match among a plurality of known sound models, it can be determined that the current environment is at some bar (or a specific bar). In some embodiments, when the current environment can be recognized, then specified notification intensity level settings can be implemented for the recognized current environment. For example, if the user frequently visits XYZ Bar and increases his/her ringer volume but turns off vibration, then the device 302 can remember this information and automatically apply the increased ringer volume while disabling vibration when the current environment of the device is identified to be XYZ Bar.

Figure 3B:
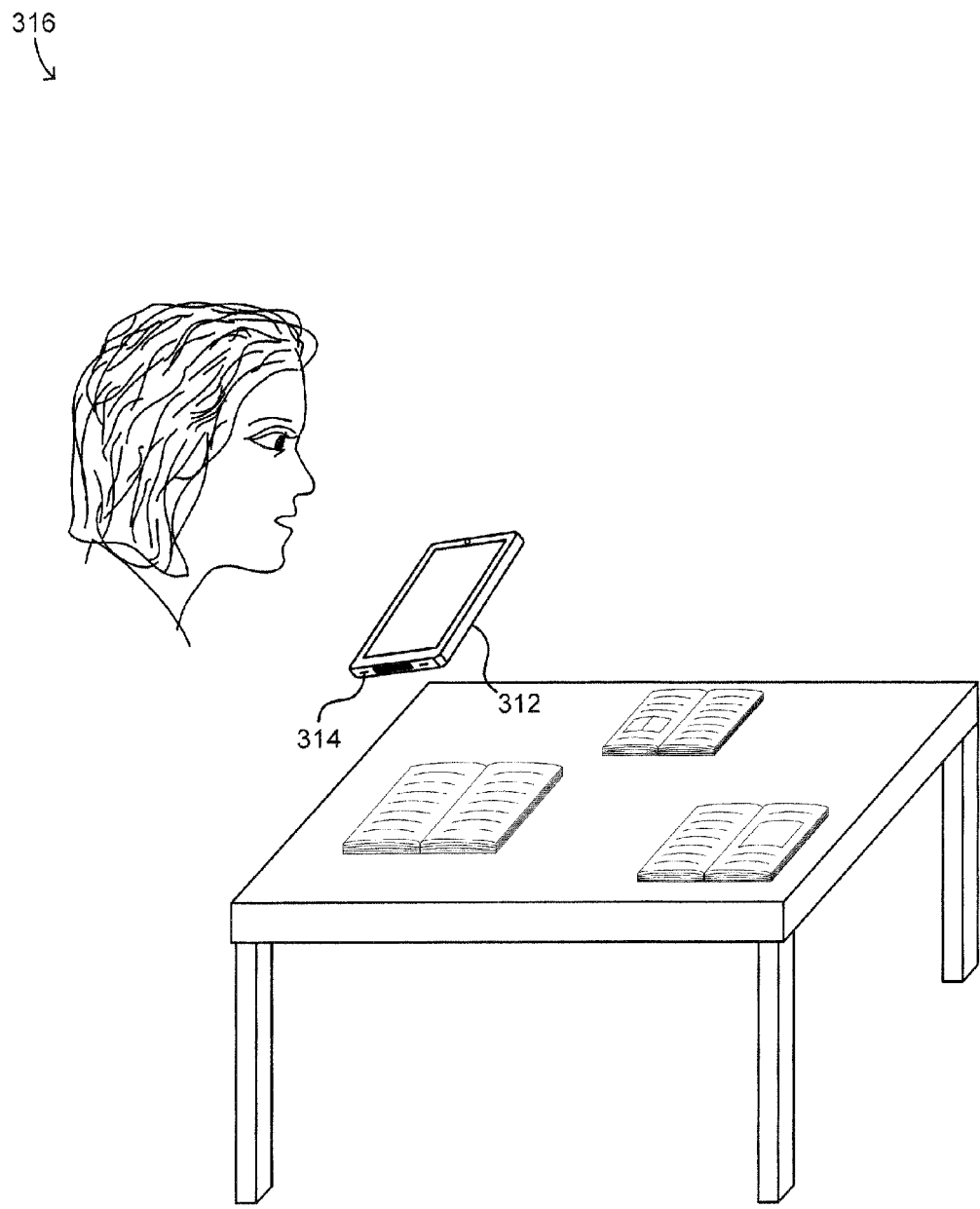
FIG. 3B illustrates an example device embodiment for configuring notification intensity level using device sensors.

FIG. 3B illustrates an example device embodiment 312 for configuring notification intensity level using device sensors. In FIG. 3B, the example computing device embodiment 312 can utilize a microphone 314 to capture sound data associated with a current environment 316 of the device 312. The microphone 314 can capture background or ambient associated with the current environment 316. In the example of FIG. 3B, the device 312 can determine from the captured sound data that the current environment 316 is a quiet environment, such as a library. Therefore, the device 312 can decrease its notification intensity level. In some embodiments, decreasing the notification intensity level can including disable audible alerts/notifications while enabling vibration alerts/notifications.

Figure 3C:
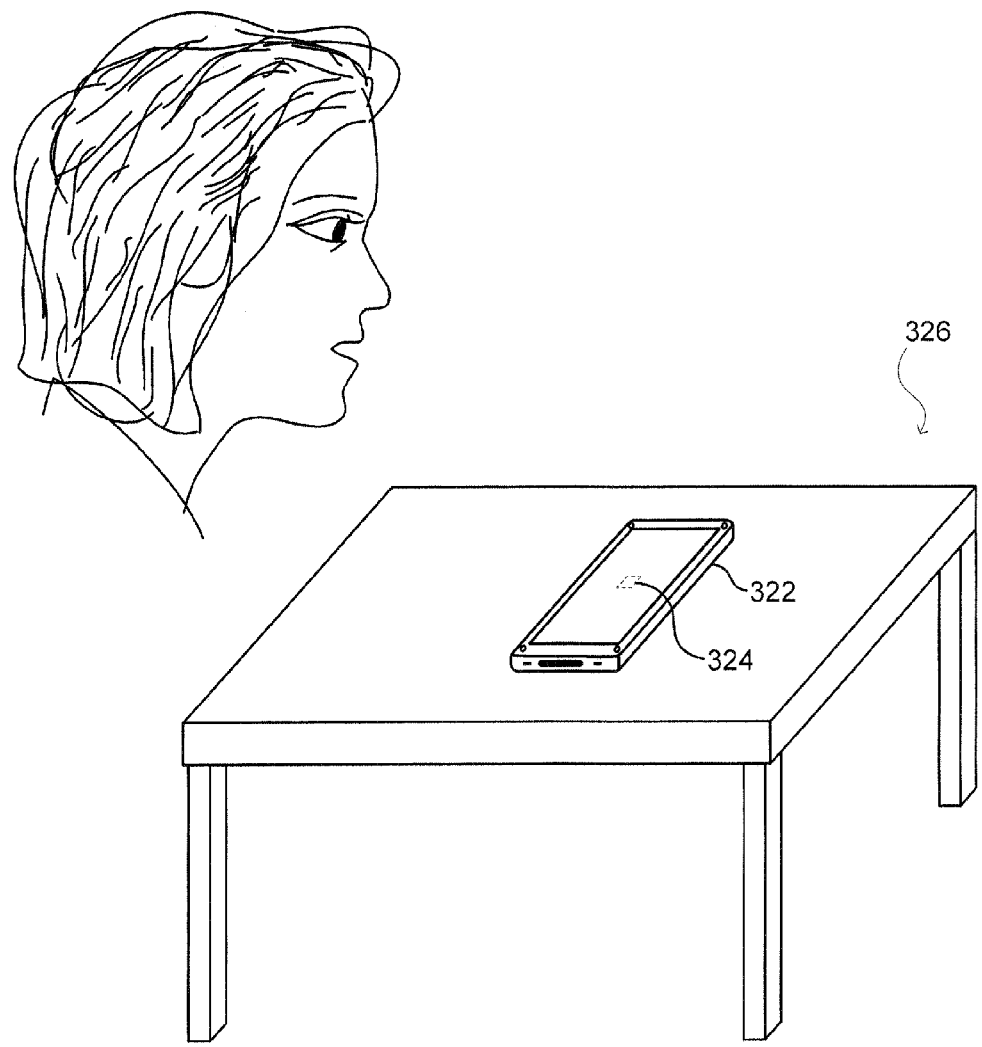
FIG. 3C illustrates an example device embodiment for configuring notification intensity level using device sensors.

FIG. 3C illustrates an example device embodiment 322 for configuring notification intensity level using device sensors. The example computing device embodiment 322 can utilize an orientation sensor 324 to determine/identify a current state/condition of the device 322. In the example of FIG. 3C, the example computing device embodiment 322 can utilize the orientation sensor 324 to obtain orientation information associated with the device 322. For example, the orientation sensor 324 can facilitate in determining that the device 322 has a current state wherein its orientation is substantially parallel (i.e., within an allowable from being parallel) to a horizontal plane, such as the ground.

Continuing with the example, the device 322 can determine that it is likely lying on a flat surface, such as a desk at an office, a table at home, etc. Accordingly, in some embodiments, the notification intensity level can be set relatively low but can be increased over time (e.g., ascending at periodic time intervals) when the user does not respond to the notifications produced at the set level within an allowable time frame (e.g., within each time interval).

Moreover, in some embodiments, when it is determined that the device 322 is likely on a table or desk, vibrations can be disabled. This can prevent undesired sound caused by vibration as well as prevent the device 322 from falling off the edge of the table or desk due to vibration.

In some embodiments, the orientation sensor 324 can facilitate in determining the current environment. For example, a device cradle/holder in a car holds the device 322 in particular orientation, such that when the orientation sensor 324 detects that the device 322 is in this particular orientation, then the current environment of the device 322 is likely to be the device cradle/holder in the car. Similarly, the orientation sensor 324 can detect bumps associated with car rides, and/or orientation change patterns associated with the user walking, etc.

Figure 3D:
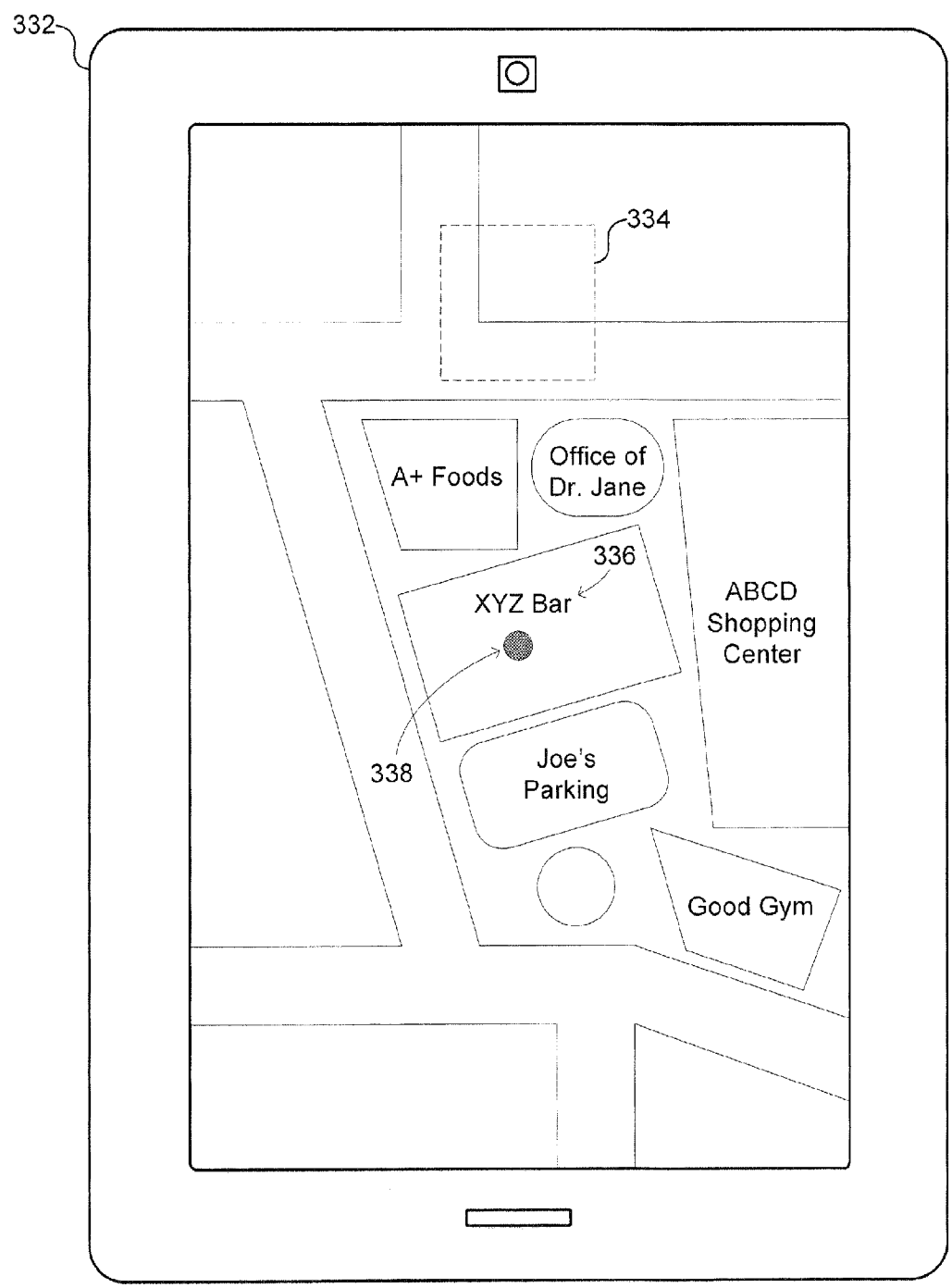
FIG. 3D illustrates an example device embodiment for configuring notification intensity level using device sensors.

FIG. 3D illustrates an example device embodiment 332 for configuring notification intensity level using device sensors. The example computing device 332 can utilize a location sensor 334, such as a GPS chip or a radio transceiver (e.g., for cellular triangulation, etc.), to determine a current environment, state, condition, property, etc. of the device 332. For example, the location sensor 334 can determine a current geolocation 336 of the device 332. The device 332 can obtain information associated with the geolocation (e.g., identify an establishment associated with the geolocation). Based on the geolocation (i.e., based on the geolocation and/or the information associated with the geolocation), the device 332 can increase its notification intensity level when the establishment likely has a loud noise level, such as XYZ Bar 338 would have, for example. Of course, when the geolocation 336 is likely associated with a low noise level, the device 332 can decrease its notification intensity level.

Figure 3E:
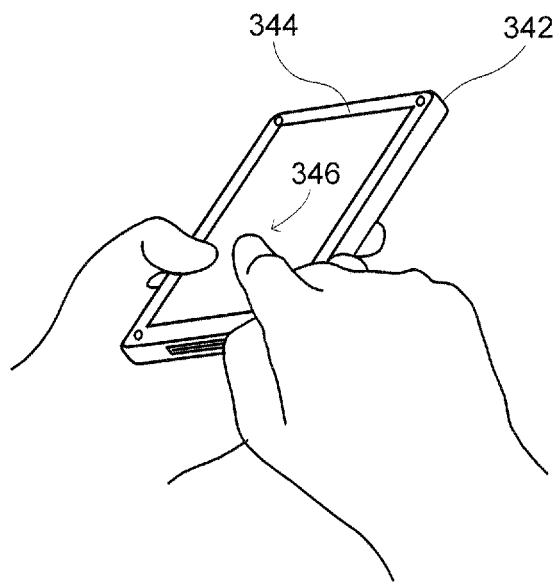
FIG. 3E illustrates an example device embodiment for configuring notification intensity level using device sensors.

FIG. 3E illustrates an example device embodiment 342 for configuring notification intensity level using device sensors. In FIG. 3E, the device 342 can use its touch sensor (e.g., touchscreen) 344 to detect a touch 346 (e.g., performed by a user of the device 342) with respect to the device 342. The touch 346 can indicate that the device 342 is actively being used (e.g., interacted with) or within an allowable time period from last being actively used (i.e., within an allowable time period of being most recently interacted with). If this is the case, then the device 342 can set its notification intensity level at a decreased level. This can be because, presumably, the user will be looking at the device 342 when there is a notification or because the user will notice the notification with relative ease.

Figure 3F:
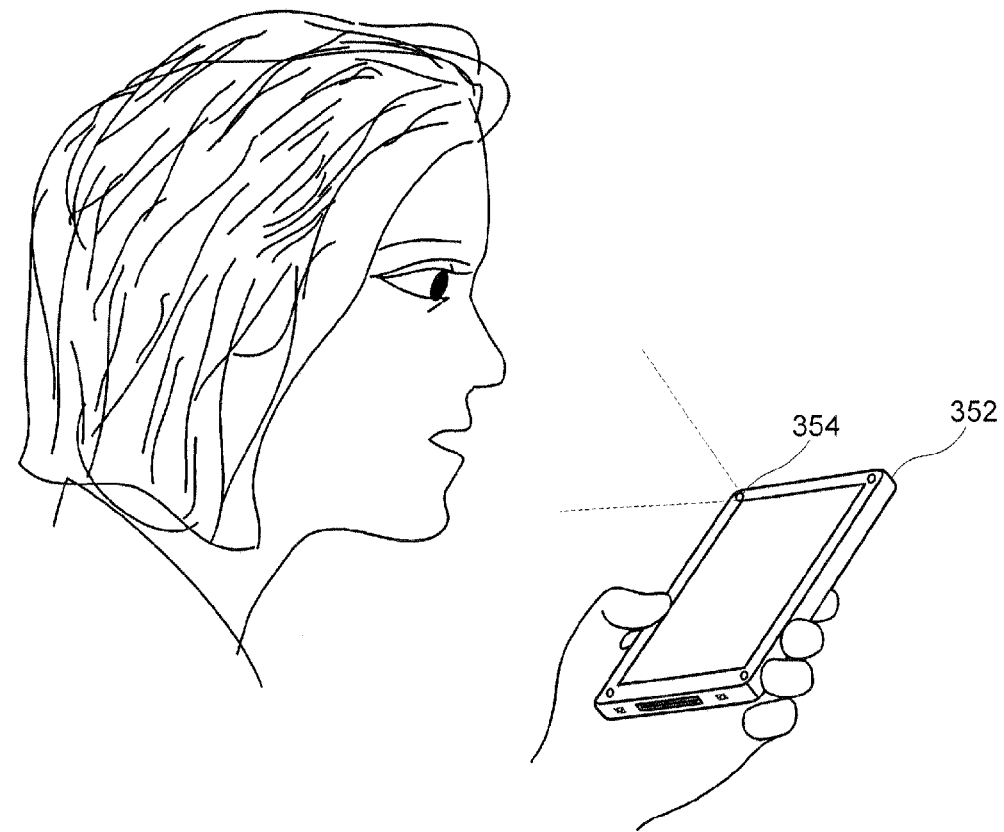
FIG. 3F illustrates an example device embodiment for configuring notification intensity level using device sensors.

FIG. 3F illustrates an example device embodiment 352 for configuring notification intensity level using device sensors. The example computing device embodiment 352 can use its camera 354 for head, eye, gaze, and/or feature (e.g., facial feature) tracking to help indicate whether or not the device 342 is actively being used (e.g., interacted with) or within an allowable time period from a time of its most recent active use. If so, then the device 352 can decrease its notification intensity level.

Moreover, head, eye, gaze, and/or feature tracking can indicate how close in proximity (e.g., distance) the user is with respect to the device 352. If the user is close, the device 352 can reduce its notification intensity level because, presumably, the user can notice notifications with relative ease if he/she is close to the device 352.

Figure 4:
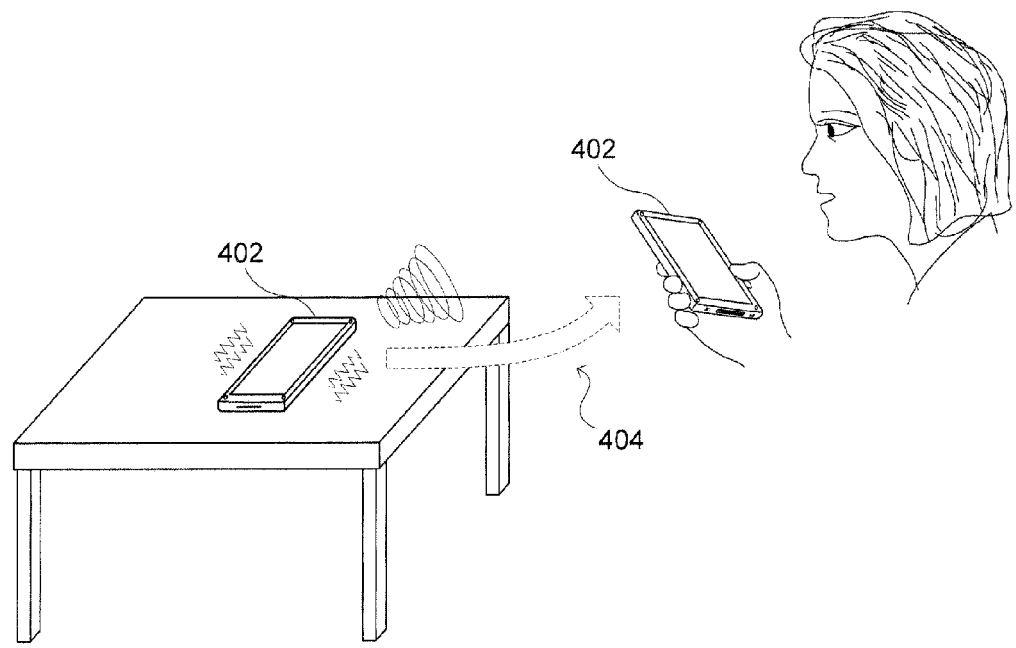
FIG. 4 illustrates an example device embodiment for configuring notification intensity level using device sensors.

FIG. 4 illustrates an example device embodiment 402 for configuring notification intensity level using device sensors. In some embodiments, the example device 402 can reduce (including disabling) its notification intensity level prior to a phone call being picked up by the user, as shown in FIG. 4. In FIG. 4, the device 402 can receive an incoming communication, such as an incoming phone call, that causes notifications (e.g., rings, vibrations, etc.) to be outputted. The device 402 determine (e.g., using its orientation sensor and/or other sensors) that it is being moved 404 from a first position to a second position, such as from lying on a table to being held by the user's hand, as shown in FIG. 4. Another example includes the device 352 being moved from its position in the user's pocket to being held by the user. Based on the movement, the device 352 can determine that the user has noticed the notifications outputted, and thus reduce the notification intensity level (or disable the outputting of the notifications).

Figure 5:
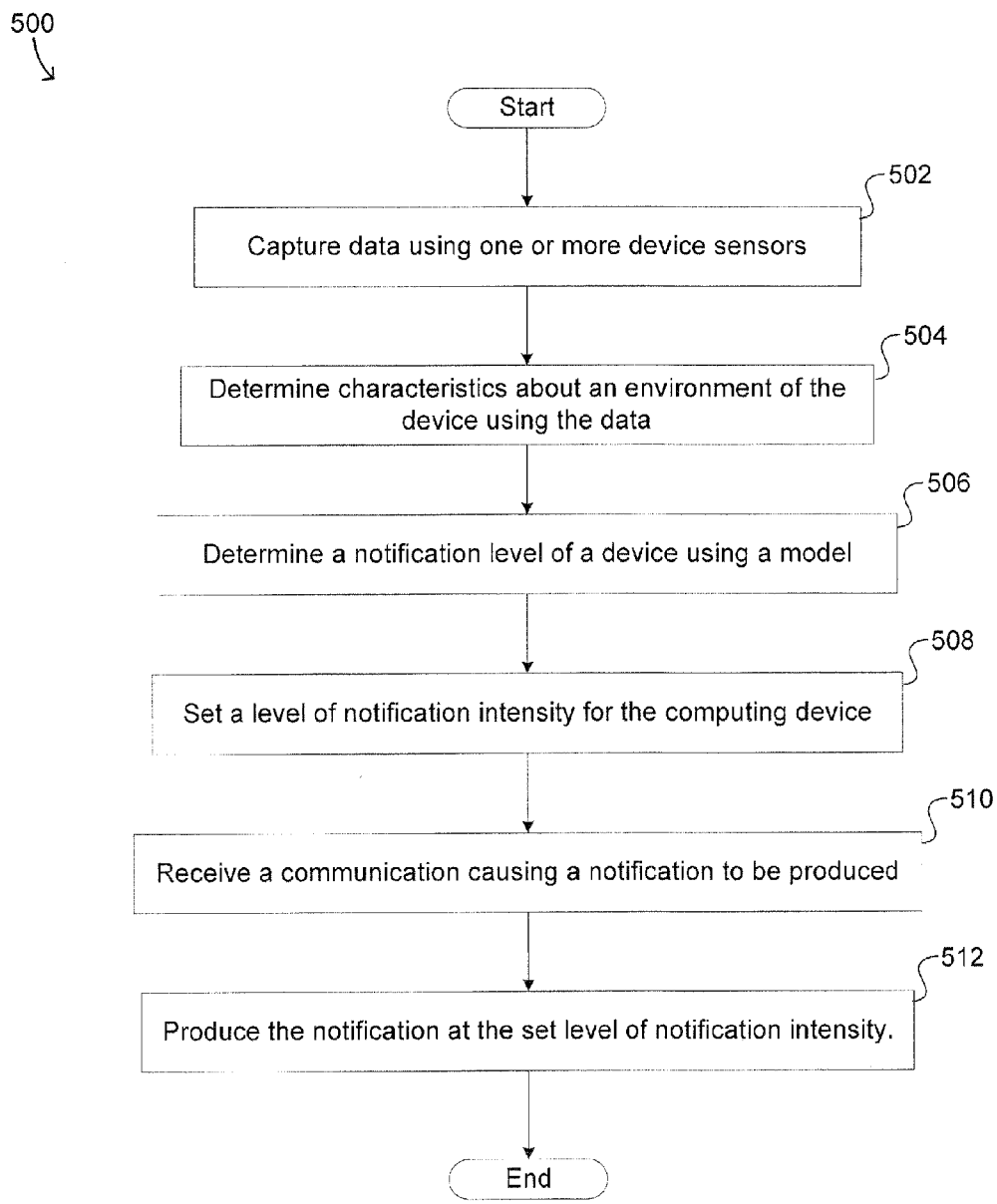
FIG. 5 illustrates an example method embodiment for configuring notification intensity level using device sensors.

FIG. 5 illustrates an example method embodiment 500 for configuring notification intensity level using device sensors. It should be understood that there can be additional, fewer, or alternative steps performed in similar or alternative orders, or in parallel, within the scope of the various embodiments unless otherwise stated. The example method embodiment 500 can start with capturing data using one or more sensors of a computing device, at step 502. The method embodiment 500 can analyze the data to determine characteristics about the environment of the device, at step 504. Step 506 can include determining a notification level of a device using a model. In some embodiments, the model may be a classification model. The determining can be based at least in part on the data from the one or more sensors, the determined characteristics, and/or other information such as device settings, user preferences, or a state of the device.

At step 508, the method 500 can set a level of notification intensity for the computing device. Then at step 510, the method 500 can receive, at the computing device, a communication that causes a notification to be produced using the computing device. Step 512 can include producing the notification at the set level of notification intensity.

Figure 6:
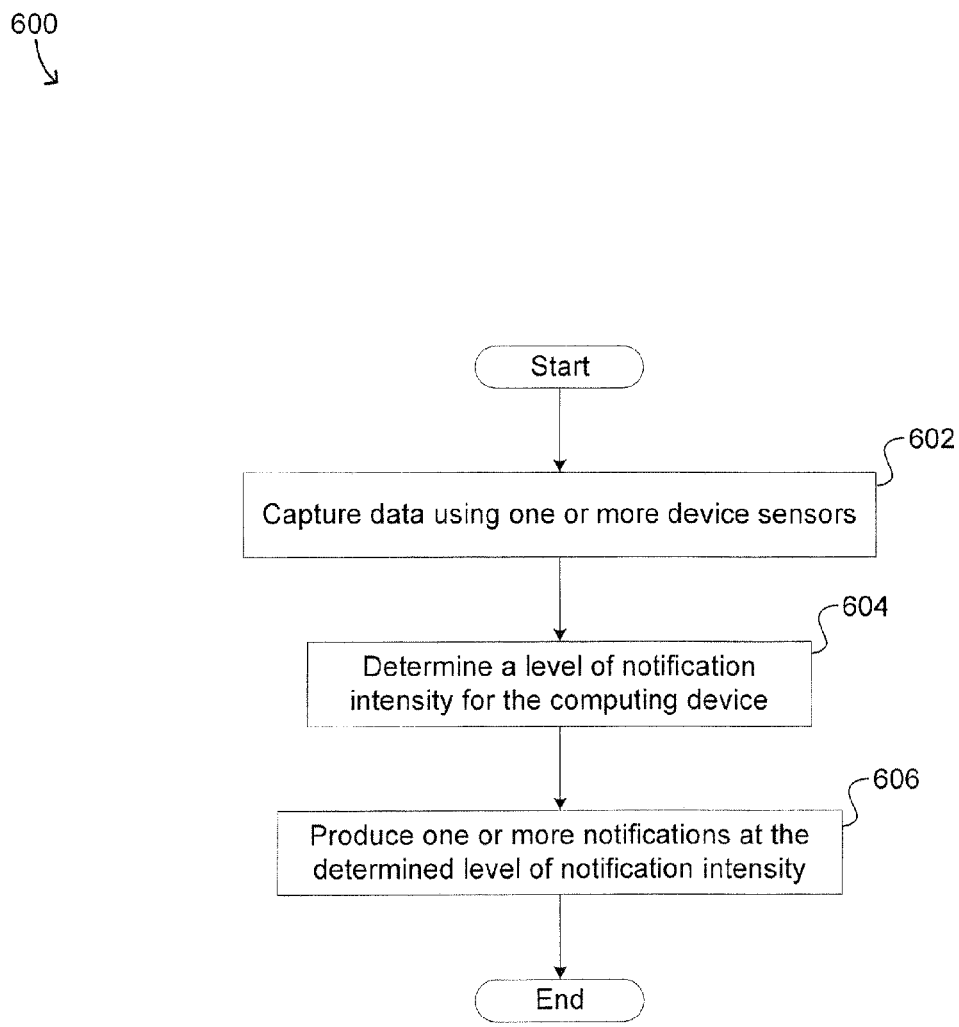
FIG. 6 illustrates an example method embodiment for configuring notification intensity level using device sensors.

FIG. 6 illustrates an example method embodiment 600 for configuring notification intensity level using device sensors. Again, it should be understood that there can be additional, fewer, or alternative steps performed in similar or alternative orders, or in parallel, within the scope of the various embodiments unless otherwise stated. At step 602, the example method embodiment 600 can capture data using one or more sensors of a computing device. The method 600 can determine a level of notification intensity for the computing device, at step 604. The determining the level of notification intensity can be based at least in part upon a model of appropriate notification intensities and at least one of the data or a current state of the computing device. Then at step 606, the method can produce one or more notifications at the determined level of notification intensity. In some embodiments, the producing the one or more notifications can occur in response to receiving, at the computing device, a communication that causes the one or more notifications to be produced.

In some embodiments, the computing device can use data from any combination of the one or more sensors. In other words, the computing device can use the device sensors in conjunction with one another.

In some embodiments, the level of notification intensity can be similar to a sliding scale (rather than being binary, e.g., either "On" or "Off"). For example, the notification intensity level can correspond to a confidence of a determination/identification of the current environment, state, condition, property, etc. If the device is 70% confident that the current environment has a loud noise level, then the notification intensity level can be set to 70% of what it would be if the device was 100% confident. In some embodiments, the computing device can interpolate among multiple current environment, state, condition, property, etc. possibilities. For example, if the device is 60% confidence that the current environment is a noisy shopping mall but 40% confident that the current environment is a quiet library, then the device can set its notification intensity level to some level in between the two possible environments (e.g., 50% intensity).

In some embodiments, one of ordinary skill in the art would recognize many models and/or algorithms that can be implemented for the disclosed technology. For example, examples can include linear regressions, decision trees, regression trees, data clustering, etc.

In some embodiments, the computing device can detect other devices. The device can obtain information about the other devices. For example, if the other devices have low notification intensity levels, then the computing device can decrease its notification intensity level as well. In another example, if numerous others have normal intensity levels and/or if at least some others have high intensity levels, then the device can increase its notification intensity level. In some embodiments, the computing device can determine that its current geolocation is a place where other devices are often set to specified notification intensities (e.g., at similar times/days of the week). As such, the computing device can adjust its own notification intensity level based on how at least some of the other devices are set.

In some embodiments, the disclosed technology can take into account user preferences and device settings, which can include system and/or internal settings/data (e.g., notes, calendar, data/time, etc.). In some embodiments, notification intensity levels can be personalized for each individual user.

In some embodiments, the disclosed technology can take into account user instruction. In some embodiments, user commands can take priority over configurations made by some embodiments presently disclosed. In some embodiments, there can be a manual mode that, when enabled, disables the automatic configuring of the notification intensity levels. In some embodiments, the automatic configuring of the notification intensity levels can take into account manual adjustments made by the user.

Various embodiments consistent with the present disclosure can also be implemented with user feedback. In some embodiments, the computing device can receive information associated with one or more user interactions with respect to the computing device within an allowable time period from when the notification is being produced. The received information can be used as user feedback to improve the technology disclosed. The device can then modify at least one of the model or the level of notification intensity based at least in part on the information associated with the one or more user interactions. For example, a user interaction can be the user holding the computing device (e.g., picking up the device); when the device detects that the user has picked up the device (e.g., in response to one or more notifications produced), the device can stop further notifications from being produced.

Figure 7:
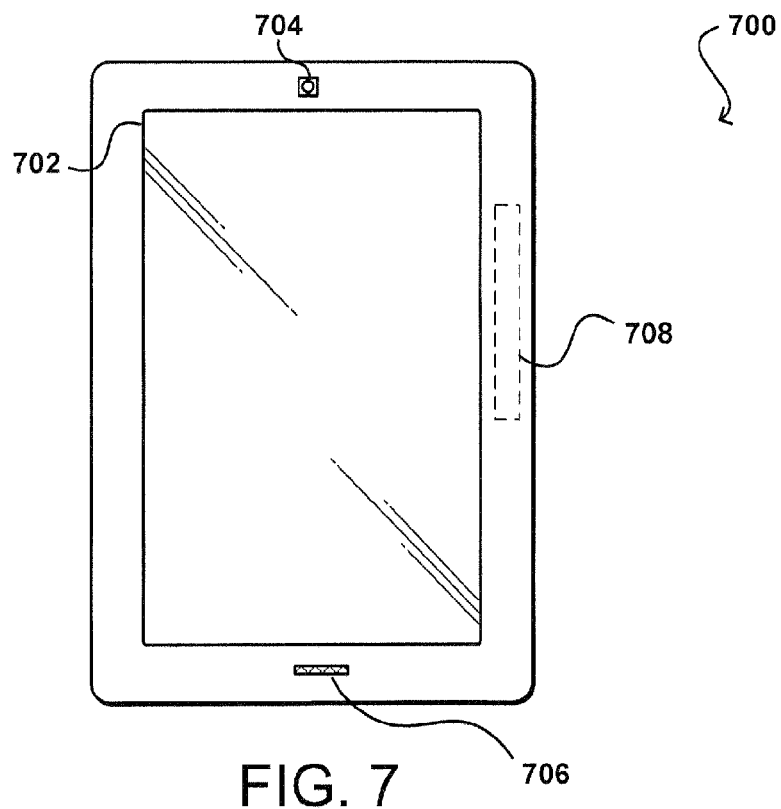
FIG. 7 illustrates an example device that can be used to implement aspects of the various embodiments.

FIG. 7 illustrates an example electronic user device 700 that can be used in accordance with various embodiments. Although a portable computing device (e.g., an electronic book reader or tablet computer) is shown, it should be understood that any electronic device capable of receiving, determining, and/or processing input can be used in accordance with various embodiments discussed herein, where the devices can include, for example, desktop computers, notebook computers, personal data assistants, smart phones, video gaming consoles, television set top boxes, and portable media players. In some embodiments, a computing device can be an analog device, such as a device that can perform signal processing using operational amplifiers. In this example, the computing device 700 has a display screen 702 on the front side, which under normal operation will display information to a user facing the display screen (e.g., on the same side of the computing device as the display screen). The computing device in this example includes at least one camera 704 or other imaging element for capturing still or video image information over at least a field of view of the at least one camera. In some embodiments, the computing device might only contain one imaging element, and in other embodiments the computing device might contain several imaging elements. Each image capture element may be, for example, a camera, a charge-coupled device (CCD), a motion detection sensor, or an infrared sensor, among many other possibilities. If there are multiple image capture elements on the computing device, the image capture elements may be of different types. In some embodiments, at least one imaging element can include at least one wide-angle optical element, such as a fish eye lens, that enables the camera to capture images over a wide range of angles, such as 180 degrees or more. Further, each image capture element can comprise a digital still camera, configured to capture subsequent frames in rapid succession, or a video camera able to capture streaming video.

The example computing device 700 also includes at least one microphone 706 or other audio capture device capable of capturing audio data, such as words or commands spoken by a user of the device. In this example, a microphone 706 is placed on the same side of the device as the display screen 702, such that the microphone will typically be better able to capture words spoken by a user of the device. In at least some embodiments, a microphone can be a directional microphone that captures sound information from substantially directly in front of the microphone, and picks up only a limited amount of sound from other directions. It should be understood that a microphone might be located on any appropriate surface of any region, face, or edge of the device in different embodiments, and that multiple microphones can be used for audio recording and filtering purposes, etc.

The example computing device 700 also includes at least one orientation sensor 708, such as a position and/or movement-determining element. Such a sensor can include, for example, an accelerometer or gyroscope operable to detect an orientation and/or change in orientation of the computing device, as well as small movements of the device. An orientation sensor also can include an electronic or digital compass, which can indicate a direction (e.g., north or south) in which the device is determined to be pointing (e.g., with respect to a primary axis or other such aspect). An orientation sensor also can include or comprise a global positioning system (GPS) or similar positioning element operable to determine relative coordinates for a position of the computing device, as well as information about relatively large movements of the device. Various embodiments can include one or more such elements in any appropriate combination. As should be understood, the algorithms or mechanisms used for determining relative position, orientation, and/or movement can depend at least in part upon the selection of elements available to the device.

Figure 8:
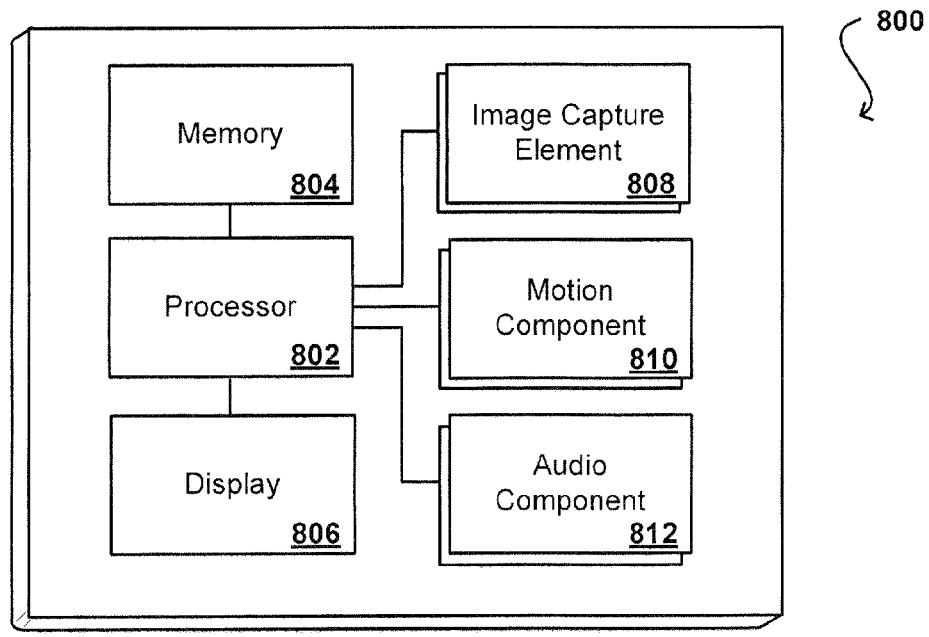
FIG. 8 illustrates example components of a client device such as that illustrated in FIG. 7.

FIG. 8 illustrates a logical arrangement of a set of general components of an example computing device 800 such as the device 700 described with respect to FIG. 7. In this example, the device includes a processor 802 for executing instructions that can be stored in a memory device or element 804. As would be apparent to one of ordinary skill in the art, the device can include many types of memory, data storage, or non-transitory computer-readable storage media, such as a first data storage for program instructions for execution by the processor 802, a separate storage for images or data, a removable memory for sharing information with other devices, etc. The device typically will include some type of display element 806, such as a touch screen or liquid crystal display (LCD), although devices such as portable media players might convey information via other means, such as through audio speakers. As discussed, the device in many embodiments will include at least one image capture element 808 such as a camera or infrared sensor that is able to image projected images or other objects in the vicinity of the device. Methods for capturing images or video using a camera element with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device. The example device similarly includes at least one audio capture component 812, such as a mono or stereo microphone or microphone array, operable to capture audio information from at least one primary direction. A microphone can be a uni- or omni-directional microphone as known for such devices.

In some embodiments, the computing device 800 of FIG. 8 can include one or more communication elements (not shown), such as a Wi-Fi, Bluetooth, RF, wired, or wireless communication system. The device in many embodiments can communicate with a network, such as the Internet, and may be able to communicate with other such devices. In some embodiments the device can include at least one additional input device able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device.

The device 800 also can include at least one orientation or motion sensor 810. As discussed, such a sensor can include an accelerometer or gyroscope operable to detect an orientation and/or change in orientation, or an electronic or digital compass, which can indicate a direction in which the device is determined to be facing. The mechanism(s) also (or alternatively) can include or comprise a global positioning system (GPS) or similar positioning element operable to determine relative coordinates for a position of the computing device, as well as information about relatively large movements of the device. The device can include other elements as well, such as may enable location determinations through triangulation or another such approach. These mechanisms can communicate with the processor 802, whereby the device can perform any of a number of actions described or suggested herein.

As an example, a computing device such as that described with respect to FIG. 7 can capture and/or track various information for a user over time. This information can include any appropriate information, such as location, actions (e.g., sending a message or creating a document), user behavior (e.g., how often a user performs a task, the amount of time a user spends on a task, the ways in which a user navigates through an interface, etc.), user preferences (e.g., how a user likes to receive information), open applications, submitted requests, received calls, and the like. As discussed above, the information can be stored in such a way that the information is linked or otherwise associated whereby a user can access the information using any appropriate dimension or group of dimensions.

Figure 9:
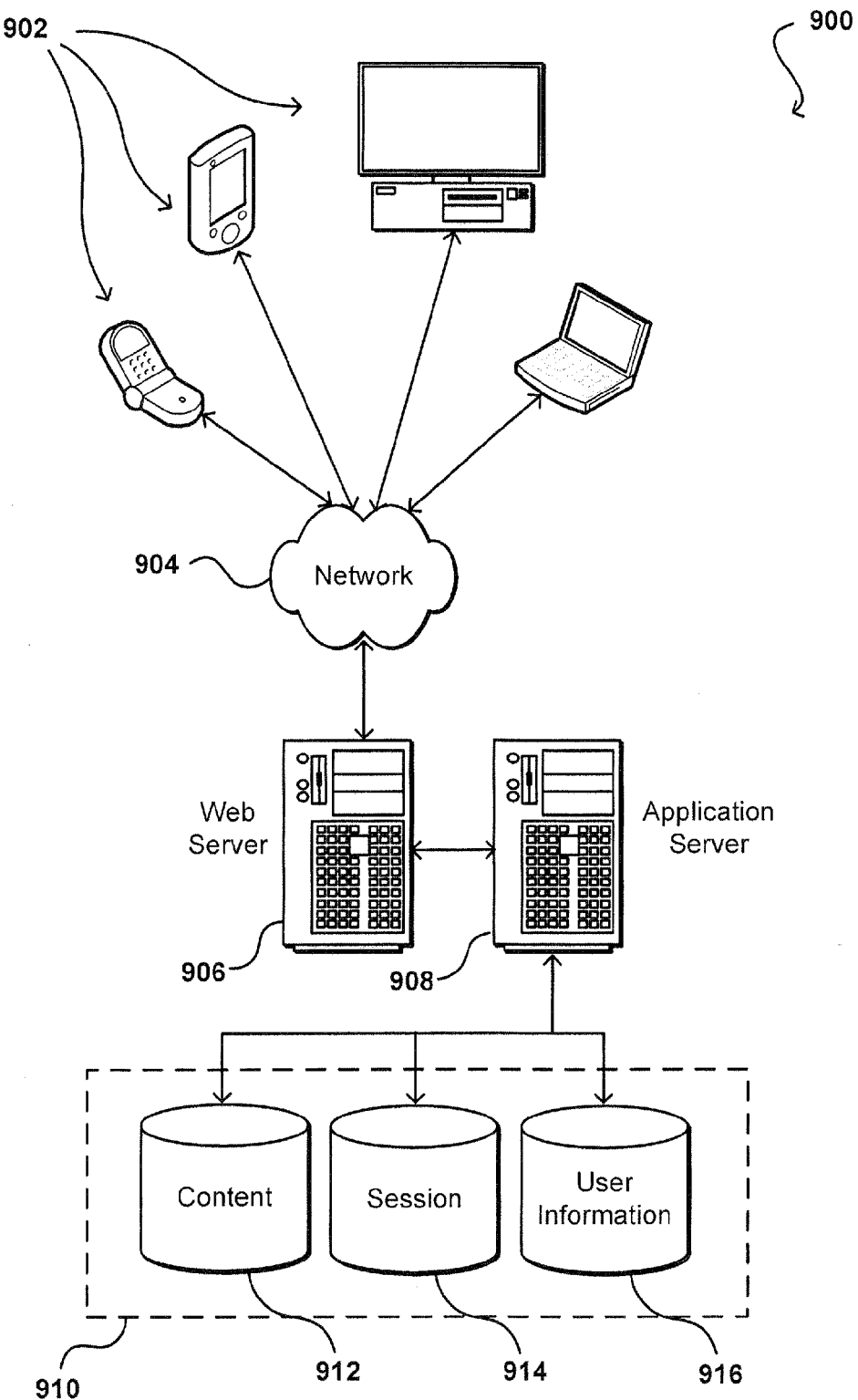
FIG. 9 illustrates an environment in which various embodiments can be implemented.

As discussed, different approaches can be implemented in various environments in accordance with the described embodiments. For example, FIG. 9 illustrates an example of an environment 900 for implementing aspects in accordance with various embodiments. As will be appreciated, although a Web-based environment is used for purposes of explanation, different environments may be used, as appropriate, to implement various embodiments. The system includes an electronic client device 902, which can include any appropriate device operable to send and receive requests, messages or information over an appropriate network 904 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server 906 for receiving requests and serving content in response thereto, although for other networks an alternative device serving a similar purpose could be used, as would be apparent to one of ordinary skill in the art.

The illustrative environment includes at least one application server 908 and a data store 910. It should be understood that there can be several application servers, layers or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device 902 and the application server 908, can be handled by the Web server 906. It should be understood that the Web and application servers are not required and are merely example components, as structured code discussed herein can be executed on any appropriate device or host machine as discussed elsewhere herein.

The data store 910 can include several separate data tables, databases or other data storage mechanisms and media for storing data relating to a particular aspect. For example, the data store illustrated includes mechanisms for storing production data 912 and user information 916, which can be used to serve content for the production side. The data store also is shown to include a mechanism for storing log or session data 914. It should be understood that there can be many other aspects that may need to be stored in the data store, such as page image information and access rights information, which can be stored in any of the above listed mechanisms as appropriate or in additional mechanisms in the data store 910. The data store 910 is operable, through logic associated therewith, to receive instructions from the application server 908 and obtain, update or otherwise process data in response thereto. In one example, a user might submit a search request for a certain type of element. In this case, the data store might access the user information to verify the identity of the user and can access the catalog detail information to obtain information about elements of that type. The information can then be returned to the user, such as in a results listing on a Web page that the user is able to view via a browser on the user device 902. Information for a particular element of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 9. Thus, the depiction of the system 900 in FIG. 9 should be taken as being illustrative in nature and not limiting to the scope of the disclosure.

As discussed above, the various embodiments can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Various aspects also can be implemented as part of at least one service or Web service, such as may be part of a service-oriented architecture. Services such as Web services can communicate using any appropriate type of messaging, such as by using messages in extensible markup language (XML) format and exchanged using an appropriate protocol such as SOAP (derived from the "Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

Most embodiments utilize at least one network that would be familiar to those skilled in the art for supporting communications using any of a variety of commercially-available protocols, such as TCP/IP, OSI, FTP, UPnP, NFS, CIFS, and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:
    capturing data using a sensor of a computing device;
    determining a volume level for the computing device based at least in part upon the data and a dynamic model that is trainable to generate specified volumes based at least in part upon one or more predictive algorithms;
    configuring the computing device using the volume level;
    receiving, at the computing device, information associated with an output sound; and
    generating the output sound at the volume level.

2. The computer-implemented method of claim 1, wherein the data corresponds to a level of noise associated with an environment of the computing device.

3. The computer-implemented method of claim 1, wherein the volume level is further based at least in part upon a confidence level corresponding to a noise level associated with an environment of the computing device.

4. The computer-implemented method of claim 1, further comprising:
    receiving information associated with one or more user interactions with respect to the computing device; and
    modifying at least one of the dynamic model or the volume level based at least in part upon the information associated with the one or more user interactions.

5. The computer-implemented method of claim 1, wherein the sensor includes at least one of a microphone, a camera, a light sensor, an orientation sensor, a location sensor, or a touch sensor.

6. A computer-implemented method comprising:
    capturing data using one or more sensors of a computing device, the data including a level of noise associated with an environment of the computing device;
    determining a volume level for the computing device based at least in part upon a dynamic model of specified volumes that utilizes the data at least in part, the dynamic model being trainable to generate the volume level based at least in part upon one or more predictive algorithms; and
    generating one or more output sounds at the volume level.

7. The computer-implemented method of claim 6, wherein the level of noise associated with the environment of the computing device is at least substantially proportional to the volume level.

8. The computer-implemented method of claim 6, wherein the volume level is further based at least in part upon a confidence level corresponding to the level of noise associated with the environment of the computing device.

9. The computer-implemented method of claim 6, further comprising:
    determining a location of the computing device based at least in part upon the data,
    wherein the volume level is further based at least in part on the location.

10. The computer-implemented method of claim 9, wherein the location is at least one of a pocket, a bag, or a holster, and wherein the method further comprises:
 increasing the volume level.

11. The computer-implemented method of claim 9, wherein the location is at least one of a home, a business, a religious institution, or a public location, and wherein the method further comprises:
 decreasing the volume level.

12. The computer-implemented method of claim 6, wherein the data includes location data of the computing device, the location data corresponds to an establishment having a high level of noise, and wherein the method further comprises increasing the volume level.

13. The computer-implemented method of claim 6, wherein the data includes location data of the computing device, the location data corresponds to an establishment having a low level of noise, and wherein the method further comprises decreasing the volume level.

14. The computer-implemented method of claim 6, wherein determining the volume level further includes:
 classifying the environment of the computing device using a classification model.

15. The computer-implemented method of claim 6, wherein the volume level is further based at least in part upon a current state of the computing device, the current state of the computing device includes at least one of an orientation of the computing device which has remained substantially horizontal for a specified duration of time, a connection of the computing device to a power source, or a user interaction with respect to the computing device within a time period.

16. The computer-implemented method of claim 6, wherein the one or more sensors include at least one of a microphone, a camera, a light sensor, an orientation sensor, a location sensor, or a touch sensor.

17. A computing device comprising:
 one or more sensors;
 a processor; and
 a memory device including instructions that, when executed by the processor, cause the computing device to:
 capture data using the one or more sensors of the computing device, the data including at least a level of noise associated with an environment of the computing device;
 determine a volume level for the computing device based at least in part upon a dynamic model of specified volumes that utilizes the data at least in part, the dynamic model being trainable to generate the volume level based at least in part upon one or more predictive algorithms; and
 generate one or more output sounds at the volume level.

18. The computing device of claim 17, wherein the one or more sensors include at least one of a microphone, a camera, a light sensor, an orientation sensor, a location sensor, or a touch sensor.

19. The computing device of claim 17, wherein the volume level is further based at least in part upon a current state of the computing device, the current state of the computing device includes at least one of an orientation of the computing device which has remained substantially horizontal for a specified duration of time, a connection of the computing device to a power source, or a user interaction with respect to the computing device within a time period.

20. The computing device of claim 17, wherein the volume level is further based at least in part upon a confidence level corresponding to the level of noise associated with the environment of the computing device.

* * * * *